United States Patent
Bao et al.

(10) Patent No.: US 9,064,871 B2
(45) Date of Patent: Jun. 23, 2015

(54) VERTICAL ELECTRONIC FUSE

(71) Applicant: International Business Machines Corporation, Armonk, NY (US)

(72) Inventors: Junjing Bao, San Diego, CA (US); Elbert E. Huang, Carmel, NY (US); Yan Zun Li, Lagrangeville, NY (US); Dan Moy, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/340,633

(22) Filed: Jul. 25, 2014

(65) Prior Publication Data

US 2014/0332856 A1 Nov. 13, 2014

Related U.S. Application Data

(62) Division of application No. 13/552,106, filed on Jul. 18, 2012, now Pat. No. 8,841,208.

(51) Int. Cl.
| | |
|---|---|
| H01L 23/52 | (2006.01) |
| H01L 21/82 | (2006.01) |
| H01L 23/525 | (2006.01) |
| H01L 23/522 | (2006.01) |
| H01L 21/768 | (2006.01) |
| H01L 23/532 | (2006.01) |

(52) U.S. Cl.
CPC ........ *H01L 23/5256* (2013.01); *H01L 23/5226* (2013.01); *H01L 23/53223* (2013.01); *H01L 23/53238* (2013.01); *H01L 23/53266* (2013.01); *H01L 23/53295* (2013.01); *H01L 21/76832* (2013.01); *H01L 21/76834* (2013.01); *H01L 21/76849* (2013.01); *H01L 2924/0002* (2013.01)

(58) Field of Classification Search
USPC .......... 257/529, E21.476, E23.149; 438/132, 438/215, 281, 333, 467, 601
See application file for complete search history.

(56) References Cited

U.S. PATENT DOCUMENTS

| | | | |
|---|---|---|---|
| 6,620,721 | B1 | 9/2003 | Lee |
| 7,737,528 | B2 | 6/2010 | Bonilla et al. |
| 7,956,466 | B2 | 6/2011 | Hsu et al. |
| 8,133,767 | B2 | 3/2012 | Yang et al. |
| 8,137,791 | B2 | 3/2012 | Anderson et al. |

(Continued)

OTHER PUBLICATIONS

Zhang et al., "Effects of Cap Layer and Grain Structure on Electromigration Reliability of Cu/Low-k Interconnects for 45 nm Technology Node", The University of Texas at Austin, Austin, TX, 2010 IEEE, pp. 5B.2.1-5B.2.5.

(Continued)

*Primary Examiner* — Khaja Ahmad
(74) *Attorney, Agent, or Firm* — Catherine Ivers; L. Jeffrey Kelly

(57) ABSTRACT

An electronic fuse structure including a first $M_x$ metal comprising a conductive cap, an $M_{x+1}$ metal located above the $M_x$ metal, wherein the $M_{x+1}$ metal does not comprise a conductive cap, and a via, wherein the via electrically connects the $M_x$ metal to the $M_{x+1}$ metal in a vertical orientation.

15 Claims, 7 Drawing Sheets

(56) References Cited

U.S. PATENT DOCUMENTS

| | | | |
|---|---|---|---|
| 2001/0036750 A1 | 11/2001 | Radens et al. | |
| 2003/0001280 A1 | 1/2003 | Noguchi et al. | |
| 2005/0179062 A1* | 8/2005 | Kajita | 257/209 |
| 2008/0070398 A1 | 3/2008 | Park et al. | |
| 2008/0157268 A1 | 7/2008 | Kim et al. | |
| 2009/0085152 A1 | 4/2009 | Bernstein et al. | |
| 2009/0309226 A1 | 12/2009 | Horak et al. | |
| 2010/0187670 A1 | 7/2010 | Lin et al. | |
| 2010/0264514 A1 | 10/2010 | Iwamoto et al. | |
| 2011/0169127 A1 | 7/2011 | Hsu et al. | |
| 2011/0254165 A1* | 10/2011 | Muranaka | 257/751 |
| 2011/0256710 A1 | 10/2011 | Kawahara | |

OTHER PUBLICATIONS

Gambino et al., "Yield and Reliability of Cu Capped with CoWP using a Self-Activated Process", IBM Microelectronics, Essex Junction, VT, 2006 IEEE, pp. 30-32.

Hu et al., "Atom Motion of Cu and Co in Cu damascene lines with a CoWP cap", Agilent Technologies, Applied Physics Letters, vol. 84, Jun. 14, 2004, pp. 4986-4988.

Christiansen et al., "Electromigration-resistance enhancement with CoWP or CuMn for advanced Cu interconnects", IBM Systems and Technology Group, 2011 IEEE, pp. 3E.3.1-3E.3.5.

Author: Disclosed Anonymously. "Method and System for Fabricating an Anti-Fuse Structure to Reduce Variability in Failure Locations of the Anti-Fuse Structure", IP.com, IPCOM000206436D, Apr. 26, 2011.

Pending Application entitled: "Electrical Fuse and Method of Making the Same", U.S. Appl. No. 13/085,568, filed Apr. 13, 2011.

Pending Application entitled: "Metal Fuse Structure for Improved Programming Capability", U.S. Appl. No. 13/399,266, filed Feb. 17, 2012.

Pending Application entitled: "Method of Forming Vertical Electronic Fuse Interconnect Structures Including A Conductive Cap", U.S. Appl. No. 13/552,106, filed Jul. 18, 2012.

* cited by examiner

VERTICAL ELECTRONIC FUSE

BACKGROUND

The present invention relates generally to semiconductors, and, more particularly, to electronic fuse interconnect structures.

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration (EM) effects to blow and create the open circuit. For example, EM can be defined as the transport of material caused by the gradual movement of ions in a conductor due to the momentum transfer between conducting electrons and diffusing metal atoms. In e-fuses that take advantage of EM effect, such transport of material caused by the gradual movement of ions can produce voids which cause the e-fuse to blow and create the open circuit.

However, in a typical vertical e-fuse EM may cause undesirable voids, thus creating the open circuit in undesirable locations. More specifically, vertical e-fuses comprise a via connecting an $M_x$ metal to an $M_{x+1}$ metal, where the $M_{x+1}$ metal is generally positioned above the $M_x$ metal. During programming, voids tend to form in the $M_x$ metal due to EM, and eventually cause the vertical e-fuse to blow and create an open circuit at the $M_x$ metal. An open circuit may be the desired result; however, causing the open circuit at the $M_x$ metal may have undesirable results. An open circuit created by a void in the $M_x$ metal may affect circuits other than the circuit targeted during programming of the e-fuse. These undesired open circuits may therefore decrease chip yield.

Also, the location of the void formation may affect the amount of current required to blow the e-fuse. Generally, higher currents may be required to form a larger void, therefore higher currents may be necessary to cause a void to form in the $M_x$ metal as opposed to the via because the $M_x$ metal may have a larger cross-sectional area than the via.

SUMMARY

According to one embodiment of the present invention, an electronic fuse structure is provided. The electronic fuse structure may include a first $M_x$ metal comprising a conductive cap; an $M_{x+1}$ metal located above the $M_x$ metal, wherein the $M_{x+1}$ metal does not comprise a conductive cap; and a via, wherein the via electrically connects the $M_x$ metal to the $M_{x+1}$ metal in a vertical orientation.

According another exemplary embodiment, a method of forming an electronic fuse is provided. The method may include providing an $M_x$ level comprising a first $M_x$ metal and a second $M_x$ metal, masking the first $M_x$ metal, forming a conductive cap over the second $M_x$ metal, and removing the mask. The method may also include depositing an $M_x$ cap dielectric above of the first $M_x$ metal, and above the second $M_x$ metal on top of the conductive cap, forming an $M_{x+1}$ level above the $M_x$ level, the $M_{x+1}$ level comprising an $M_{x+1}$ metal, and forming a via electrically connecting the $M_x$ metal to the $M_{x+1}$ metal in a vertical orientation.

According another exemplary embodiment, a method of forming an electronic fuse is provided. The method may include providing an $M_x$ level comprising a first $M_x$ metal and a second $M_x$ metal, forming a conductive cap over the first and second $M_x$ metals, masking the second $M_x$ metal, removing the conductive cap from above the first $M_x$ metal. The method may also include depositing an $M_x$ cap dielectric above of the first $M_x$ metal, and above the second $M_x$ metal on top of the conductive cap, forming an $M_{x+1}$ level above the $M_x$ level, the $M_{x+1}$ level comprising an $M_{x+1}$ metal, and forming a via electrically connecting the $M_x$ metal to the $M_{x+1}$ metal in a vertical orientation.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 2A depicts an $M_x$ level having a first $M_x$ metal and a second $M_x$ metal according to an exemplary embodiment.

FIG. 2B depicts masking the first $M_x$ metal and depositing a conductive cap above the second $M_x$ metal according to an exemplary embodiment.

FIG. 2C depicts removal of the mask and subsequent deposition of an $M_x$ cap dielectric according to an exemplary embodiment.

FIG. 2D depicts the final vertical e-fuse structure in which an $M_{x+1}$ metal is electrically connected to the second $M_x$ metal with a via according to an exemplary embodiment.

FIG. 3A depicts an $M_x$ level having a first $M_x$ metal and a second $M_x$ metal according to an exemplary embodiment.

FIG. 3B depicts the deposition of a first $M_x$ cap dielectric according to an exemplary embodiment.

FIG. 3C depicts masking the first $M_x$ metal, removing the first $M_x$ cap dielectric from above the second $M_x$ metal, and depositing a conductive cap above the second $M_x$ metal according to an exemplary embodiment.

FIG. 3D depicts the deposition of a second $M_x$ cap dielectric according to an exemplary embodiment.

FIG. 3E depicts the final vertical e-fuse structure in which an $M_{x+1}$ metal is electrically connected to the second $M_x$ metal with a via according to an exemplary embodiment.

FIG. 4A depicts an $M_x$ level having a first $M_x$ metal and a second $M_x$ metal according to an exemplary embodiment.

FIG. 4B depicts the deposition of a conductive cap above the first and second $M_x$ metals according to an exemplary embodiment.

FIG. 4C depicts masking the second $M_x$ metal and removing the conductive cap from above the first $M_x$ metal according to an exemplary embodiment.

FIG. 4D depicts the deposition of an $M_x$ cap dielectric according to an exemplary embodiment.

FIG. 4E depicts the final vertical e-fuse structure in which an $M_{x+1}$ metal is electrically connected to the second $M_x$ metal with a via according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to an e-fuse structure, and more particularly, a vertical e-fuse structure containing various capping materials. The vertical e-fuse structure may include various capping layer materials at an interface between a metallization metal and a via to provide different interfacial properties, for example, EM resistance.

Advantageously, the formation of the vertical e-fuse structure of the present invention can be implemented in front-end-of-line (FEOL) and back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention thus allows vertical e-fuses to be fabricated during normal interconnect process flows, thus advantageously reducing processing costs for manufacturing e-fuses which are normally fabricated in different process flows.

More specifically, multilayer electronic components comprise multiple layers of a dielectric material having metallization on each layer in the form of vias, pads, straps connecting pads to vias, and wiring. Vias or other openings in the dielectric layer extend from one layer to another layer. These openings are filled with a conductive material and electrically connect the metallization on one layer to the metallization on another layer and provide for the high-density electronic component devices now used in industry. The metallization on each dielectric layer may be formed using a filling technique such as electroplating, electroless plating, chemical vapor deposition, physical vapor deposition or a combination of methods. The metallization and dielectric layer may be capped with a cap dielectric, which may be, for example, nitride.

Figure 1:
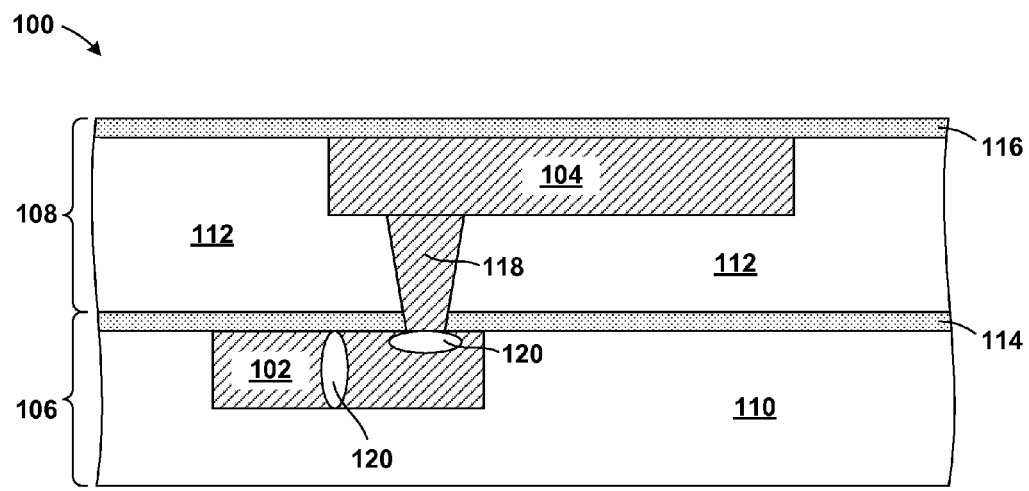
FIG. 1 depicts a cross-sectional view of a vertical e-fuse after programming according to the prior art.

By way of example FIG. 1 illustrates a structure 100 having a typical vertical e-fuse structure in which the EM failure mode of the vertical via-interconnect e-fuse structure after programming is depicted. The vertical e-fuse may include an $M_x$ level 106, an $M_{x+1}$ level 108, and a via 118. The $M_x$ level 106 may include an $M_x$ dielectric 110 and an $M_x$ metal 102. The $M_{x+1}$ level 108 may include an $M_{x+1}$ dielectric 112 and an $M_{x+1}$ metal 104. An $M_x$ cap dielectric 114 may be located between the $M_x$ dielectric 110 and the $M_{x+1}$ dielectric 112 and electrically insulate the $M_x$ metal 102 from the $M_{x+1}$ metal 104. An $M_{x+1}$ cap dielectric 116 may be located above the $M_{x+1}$ dielectric 112 and electrically insulate the $M_{x+1}$ metal 104 layer from additional interconnect levels (not shown) that may be subsequently formed above.

The via 118 electrically connects the $M_x$ metal 102 to the $M_{x+1}$ metal 104. The $M_x$ metal 102, the $M_{x+1}$ metal 104, and the via 118 make up the typical vertical e-fuse. The e-fuse is a structure that may be blown in accordance with the application of a suitable electrical current. For example, an electrical current may be provided through the e-fuse to eventually cause the e-fuse to blow and create an open circuit. Programming refers to blowing an e-fuse and creating the open circuit. A suitable electrical current may range from about 10 mA to about 15 mA, and ranges there between. Additionally, a circuit is considered to be programmed, and open, when the e-fuse resistance is equal to or exceeds about 10K ohms. During programming of a vertical e-fuse, voids 120 unexpectedly form due to non-optimized processing. Formation of the voids 120 is uncontrollable and affects the yield and reliability of the vertical e-fuse. The voids 120 are due in part to the EM of material from the $M_x$ metal 102 to the via 118. The voids 120 located in the $M_x$ metal 102 cause the vertical e-fuse to blow at the $M_x$ metal 102. Therefore, an open circuit is formed at the $M_x$ metal 102 during programming. An open circuit may be the desired result of programming the vertical e-fuse, however, an open circuit in the $M_x$ metal 102 may affect other circuits (not shown) that may be connected to the a $M_x$ metal 102.

Ideally programming will cause only the targeted vertical e-fuse to blow while maintaining the integrity of all surrounding circuits. One way to ensure the open circuit caused by programming only causes the targeted vertical e-fuse to blow may be to force void formation and therefore force an open circuit to occur within the via only. One method by which to ensure that only the vertical e-fuse is affected by programming is described in detail below by referring to the accompanying drawings FIGS. 2A-2D. It should be noted that while only two $M_x$ metals are depicted in the following set of drawings a single chip may include more than two $M_x$ metals.

Figure 2A:
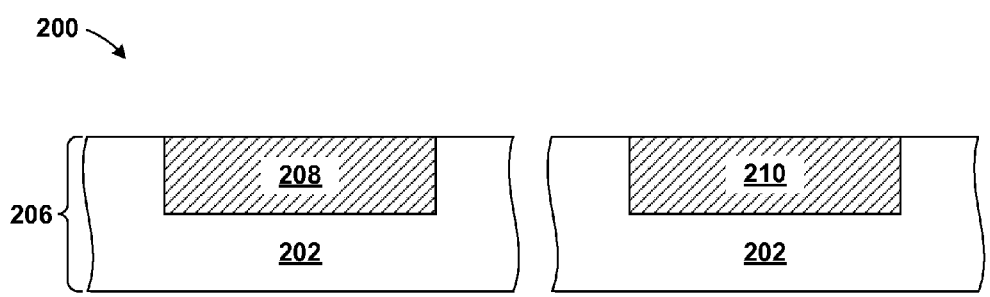
FIGS. 2A-2D illustrate the steps of a method of forming a vertical e-fuse according to an exemplary embodiment.

Referring now to FIG. 2A, a structure 200 is shown. The structure 200 may include an $M_x$ level 206. The $M_x$ level 206 may include an $M_x$ dielectric 202, a first $M_x$ metal 208, a second $M_x$ metal 210, and an $M_x$ cap dielectric 216 (not shown, see FIG. 2C). The $M_x$ dielectric 202 may be, for example, $SiO_2$, $Si_3N_4$, SiCOH, SiLK, JSR, or porous dielectrics. The $M_x$ level 206 may be any interconnect level in the structure 200. It should be noted that while only a single interconnect level is shown, the structure 200 may have multiple interconnect levels above and below the $M_x$ level 206. The $M_x$ cap dielectric 216 may be subsequently deposited during a later step (see FIG. 2C).

The first $M_x$ metal 208 and the second $M_x$ metal 210 may be formed in the $M_x$ dielectric 202 in accordance with typical techniques. The first $M_x$ metal 208 may consist of a typical line or wire found in a typical semiconductor circuit and the second $M_x$ metal 210 may consist of a line or wire which will form the base structure for a vertical e-fuse. The first $M_x$ metal 208 and the second $M_x$ metal 210 may be fabricated using, for example, a typical single damascene technique in which a conductive interconnect material may be deposited in a trench formed in the $M_x$ dielectric 202. In one embodiment, the first $M_x$ metal 208 and the second $M_x$ metal 210 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited using an electroplating technique prior to filling the trench.

Figure 2B:
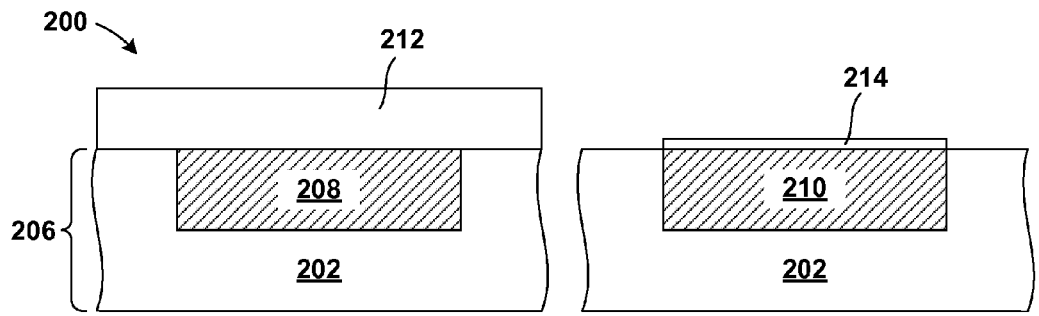

Referring now to FIG. 2B, a mask 212 may be applied above the first $M_x$ metal 208. The mask 212 may be applied above all areas of the structure 200 unrelated to the formation of a vertical e-fuse. The mask 212 can be a soft mask such as photoresist or a hardmask layer such as TEOS (silicon nitride). Both the soft mask and the hard mask may be suitable for protecting against a subsequent deposition technique. A conductive cap 214 may then be selectively deposited on top of the second $M_x$ metal 210. The conductive cap 214 may include, for example, Co (W,P,B), Ru, Ir, Rh, Pt, Mn, or an alloy thereof. In one embodiment, the conductive cap 214 may include multiple layers of either metal or metal alloys, or both. The conductive cap 214 may have a thickness ranging from about 5 nm to about 10 nm and ranges there between, although a thickness less than 5 nm and greater than 10 nm may be acceptable. The conductive cap 214 may be deposited by chemical vapor deposition, atomic layer deposition, electroplating, and electroless plating techniques. In one embodiment, the conductive cap 214 may include, for example, CoWP deposited using a plating technique where the interconnect material of the second $M_x$ metal 210 serves as a seed. Persons having ordinary skill in the art will understand that the conductive cap 214 may include other materials, depending on the desired programming efficiencies of the vertical e-fuse.

Figure 2C:
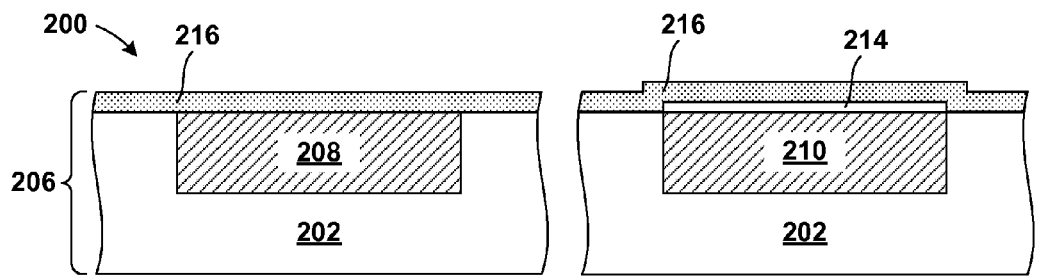

Referring now to FIG. 2C, the mask 212 (shown in FIG. 2B) may be removed. When the soft mask is used, it can be removed, for example, by ashing, after deposition of the conductive cap 214. When the hardmask is used, it can be removed, for example, by selective etching, after deposition of the conductive cap 214. The $M_x$ cap dielectric 216 may be deposited over the structure 200. The $M_x$ cap dielectric 216 may electrically insulate the $M_x$ level 206 from additional interconnect levels (not shown) that may be subsequently formed above the $M_x$ level 206. The $M_x$ cap dielectric 216 may be deposited using typical deposition techniques, for example, chemical vapor deposition. The $M_x$ cap dielectric 216 may include, for example, $Si_3N_4$, SiC, SiCN, SiCH, or other known capping materials. The $M_x$ cap dielectric 216 may have a thickness ranging from about 20 nm to about 30 nm and ranges there between, although a thickness less than 20 nm and greater than 30 nm may be acceptable.

Figure 2D:
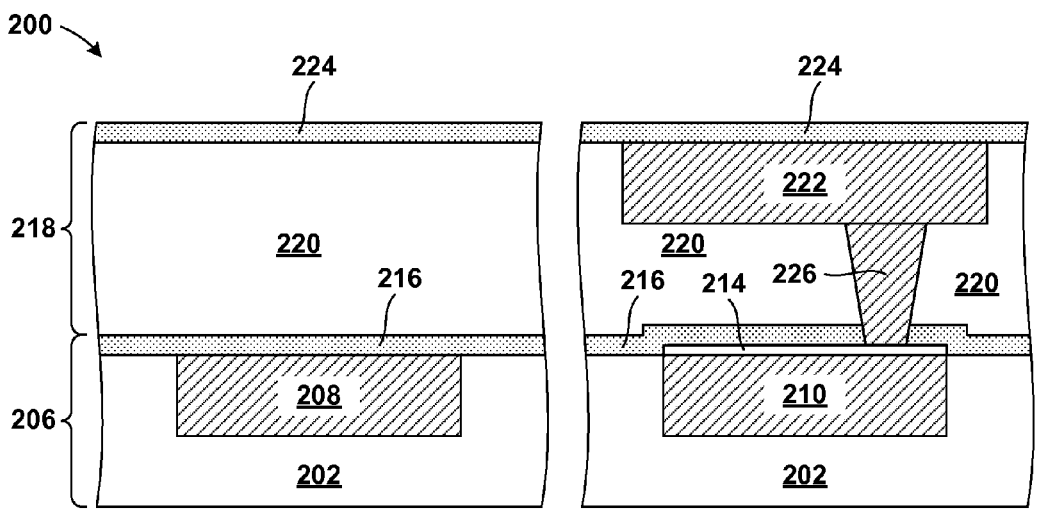

Referring now to FIG. 2D, an $M_{x+1}$ level 218 located above the $M_x$ level 206 is shown. The $M_{x+1}$ level 218 may include an $M_{x+1}$ dielectric 220 and an $M_{x+1}$ metal 222. Like the $M_x$ dielectric 202, the $M_{x+1}$ dielectric 220 may be, for example, $SiO_2$, $Si_3N_4$, SiCOH, SiLK, JSR, or porous dielectrics. It should be noted that while only two interconnect levels are shown, the structure 200 may have multiple interconnect levels above the $M_{x+1}$ level 218 and below the $M_x$ level 206. An $M_{x+1}$ cap dielectric 224 may be deposited over the structure 200 and above the $M_{x+1}$ level 218. The $M_{x+1}$ cap dielectric 224 may electrically insulate the $M_{x+1}$ level 218 from additional interconnect levels (not shown) that may be subsequently formed above the $M_{x+1}$ level 218. Like the $M_x$ cap dielectric 216, the $M_{x+1}$ cap dielectric 224 may be deposited using typical deposition techniques, for example, chemical vapor deposition. The $M_{x+1}$ cap dielectric 224 may include, for example, $Si_3N_4$, SiC, SiCN, SiCH, or other known capping materials. The $M_{x+1}$ cap dielectric 224 may have a thickness ranging from about 20 nm to about 30 nm and ranges there between, although a thickness less than 20 nm and greater than 30 nm may be acceptable.

The $M_{x+1}$ metal 222 and a via 226 may be formed in the $M_{x+1}$ dielectric 220 in accordance with typical techniques. The $M_{x+1}$ metal 222 may consist of a typical line or wire found in a typical semiconductor circuit and may consist of a line or wire which will form the base structure for the vertical e-fuse. The via 226 may typically be formed concurrent with the formation of the $M_{x+1}$ metal 222. The $M_{x+1}$ metal 222 and the via 226 may be fabricated using, for example, a typical double damascene technique in which the conductive interconnect material may be deposited in a via and a trench formed in the $M_{x+1}$ dielectric 220. In one embodiment, the $M_{x+1}$ metal 222 and the via 226 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique.

Vias, generally, may be used to form electrical connections between the metallization of two interconnect levels. The via 226 may provide an electrical connection between the second $M_x$ metal 210 and the $M_{x+1}$ metal 222. The via 226 may have an aspect ratio of about 4:1 or more, and a diameter or width ranging from about 10 nm to about 50 nm and ranges there between, although a via diameter less than 10 nm and greater than 50 nm may be acceptable.

With continued reference to FIG. 2D, the final vertical e-fuse structure is shown. The left side of FIG. 2D represents a non-fuse structure, while the right side of FIG. 2D represents the vertical e-fuse structure. The second $M_x$ metal 210, the $M_{x+1}$ metal 222, and the via 226 together form the final vertical e-fuse structure. It should be noted that neither the first $M_x$ metal 208 nor the $M_{x+1}$ metal 222 have a conductive cap. Assuming current flows from the second $M_x$ metal 210 to the $M_{x+1}$ metal 222, the addition of the conductive cap 214, on top of the second $M_x$ metal 210, improves EM resistance of the vertical e-fuse between the second $M_x$ metal 210 and the via 226, while simultaneously decreasing EM resistance of the vertical e-fuse between the via 226 and the $M_{x+1}$ metal 222. Increased EM resistance of the vertical e-fuse between the second $M_x$ metal 210 and the via 226 may help prevent the migration of the conductive interconnect material from the second $M_x$ metal 210 to the via 226. This in turn may prevent the formation of voids 120 (shown in FIG. 1) from forming in the second $M_x$ metal 210 and causing the undesirable open circuit in the second $M_x$ metal 210.

Figure 2E:
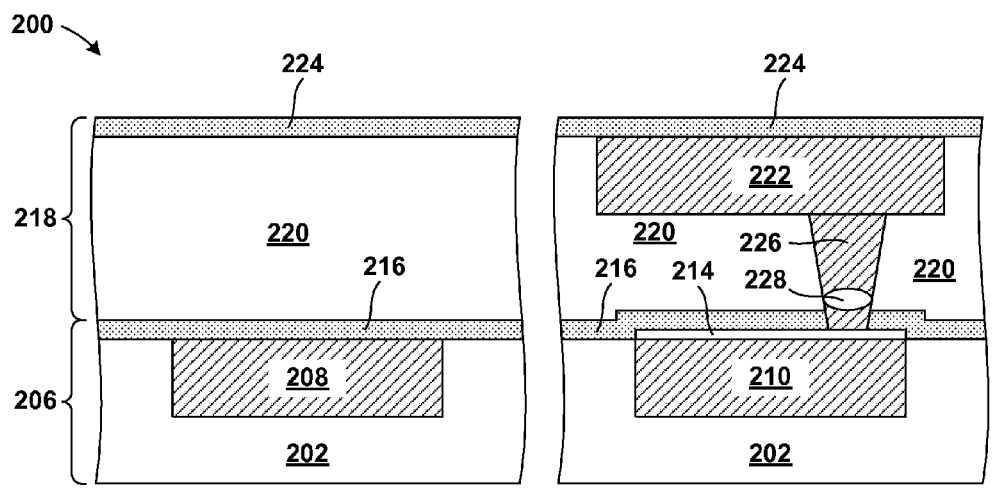
FIG. 2E depicts the final vertical e-fuse structure after programming according to an exemplary embodiment.

Now referring to FIG. 2E, the final vertical e-fuse structure is shown after programming. Decreased EM resistance of the vertical e-fuse between the via 226 and the $M_{x+1}$ metal 222 may result in the migration of the conductive interconnect material from the via 226 to the $M_{x+1}$ metal 222 and encourage the formation of a void 228 in the via 226. This configuration may provide more consistency and reliability during programming of the vertical e-fuse because the void 228, or open circuit, may be more likely located in the via 226 as opposed to the second $M_x$ metal 210. Therefore, programming may not affect any other circuit other than the targeted e-fuse because the void 228, or open circuit, may be consistently located only in the via 226.

Another method by which to ensure that only the vertical e-fuse is affected by programming is described in detail below by referring to the accompanying drawings FIGS. 3A-3E. It should be noted that while only two $M_x$ metals are depicted in the following set of drawings a single chip may include more than two $M_x$ metals.

Figure 3A:
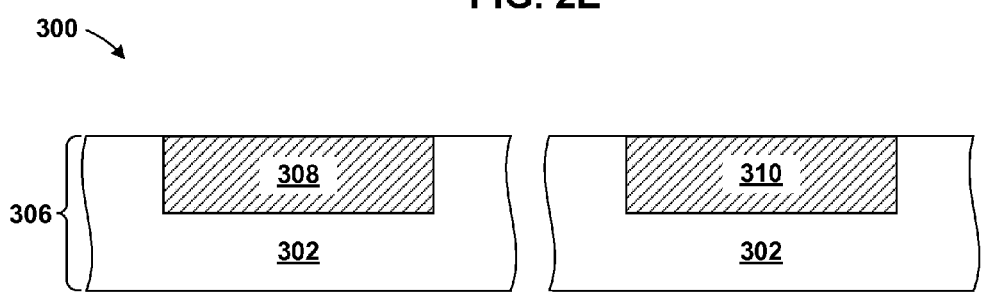
FIGS. 3A-3E illustrate the steps of a method of forming a vertical e-fuse according to an exemplary embodiment.

Referring now to FIG. 3A, a structure 300 is shown. The structure 300 may include an $M_x$ level 306. The $M_x$ level 306 may include an $M_x$ dielectric 302, a first $M_x$ metal 308, a second $M_x$ metal 310, and a first $M_x$ cap dielectric 316 (not shown, see FIG. 3C). The $M_x$ dielectric 302 may be, for example, $SiO_2$, $Si_3N_4$, SiCOH, SiLK, JSR, or porous dielectrics. The $M_x$ level 306 may be any interconnect level in the structure 300. It should be noted that while only a single interconnect level is shown, the structure 300 may have multiple interconnect levels above and below the $M_x$ level 306. The first $M_x$ cap dielectric 316 may be subsequently deposited during a later step (see FIG. 3B).

The first $M_x$ metal 308 and the second $M_x$ metal 310 may be formed in the $M_x$ dielectric 302 in accordance with typical techniques. The first $M_x$ metal 308 may consist of a typical line or wire found in a typical semiconductor circuit and the second $M_x$ metal 310 may consist of a line or wire which will form the base structure for a vertical e-fuse. The first $M_x$ metal 308 and the second $M_x$ metal 310 may be fabricated using, for example, a typical single damascene technique in which a conductive interconnect material may be deposited in a trench formed in the $M_x$ dielectric 302. In one embodiment, the first $M_x$ metal 308 and the second $M_x$ metal 310 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited using an electroplating technique prior to filling the trench.

Figure 3B:
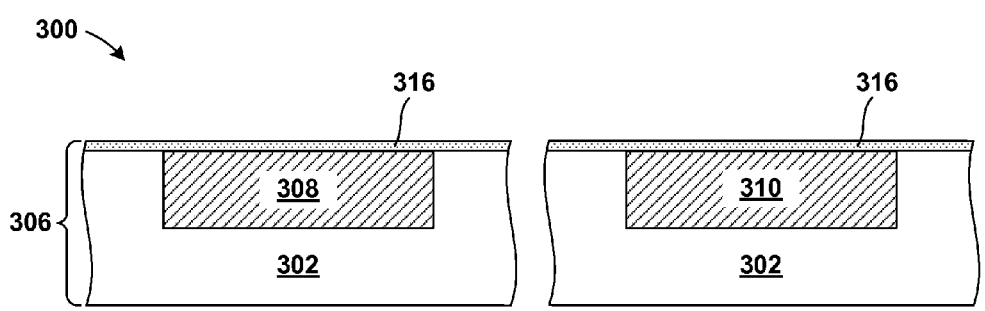

Referring now to FIG. 3B, the first $M_x$ cap dielectric 316 may be deposited over the structure 300. The first $M_x$ cap dielectric 316 may electrically insulate the $M_x$ level 306 from additional interconnect levels (not shown) that may be subsequently formed above the $M_x$ level 306. The first $M_x$ cap dielectric 316 may be deposited using typical deposition techniques, for example, chemical vapor deposition. The first $M_x$ cap dielectric 316 may include, for example, $Si_3N_4$, SiC, SiCN, SiCH, or other known capping materials. The first $M_x$ cap dielectric 316 may have a thickness ranging from about 10 nm to about 15 nm and ranges there between, although a thickness less than 10 nm and greater than 15 nm may be acceptable.

Figure 3C:
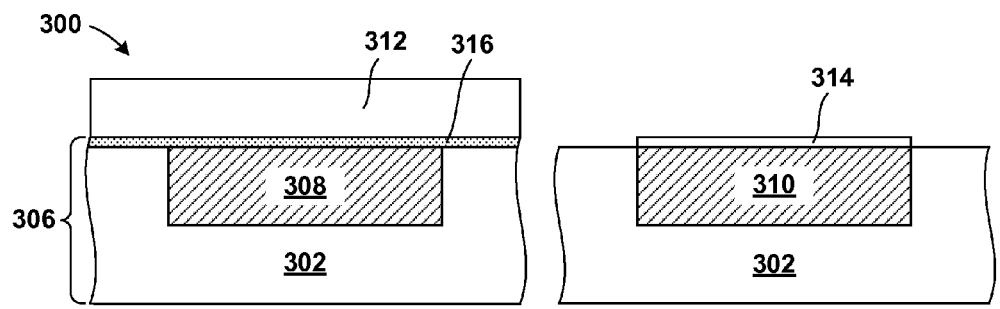

Referring now to FIG. 3C, a mask 312 may be applied on top of the first $M_x$ cap dielectric 316 above the first $M_x$ metal 308. The mask 312 may be applied above all areas of the structure 300 unrelated to the formation of a vertical e-fuse. The mask 312 can be a soft mask such as photoresist or a hardmask layer such as TEOS (silicon nitride). Both the soft mask and the hard mask may be suitable for protecting against subsequent etching and deposition techniques. A portion (not shown) of the first $M_x$ cap dielectric 316 positioned above the second $M_x$ metal 310 may be removed. The portion of the first $M_x$ cap dielectric 316 may be removed using any suitable etching technique such as dry etch, wet etch, or combination of both. In one embodiment, the portion of the first $M_x$ cap dielectric 316 may be removed using dry etch such as plasma etch. Removal of the portion of the first $M_x$ cap dielectric 316 may expose the interconnect material of the second $M_x$ metal 310.

With continued reference to FIG. 3C, a conductive cap 314 may then be selectively deposited on top of the second $M_x$ metal 310. The conductive cap 314 may include, for example, Co (W,P,B), Ru, Ir, Rh, Pt, Mn, or an alloy thereof. The conductive cap 314 may have a thickness ranging from about 5 nm to about 10 nm and ranges there between, although a thickness less than 5 nm and greater than 10 nm may be acceptable. The conductive cap 314 may be deposited by chemical vapor deposition, atomic layer deposition, electroplating, and electroless plating techniques. In one embodiment, the conductive cap 314 may include, for example, CoWP deposited using a plating technique where the interconnect material of the second $M_x$ metal 310 serves as a seed. Persons having ordinary skill in the art will understand that the conductive cap 314 may include other materials, depending on the desired programming efficiencies of the e-fuse.

Figure 3D:
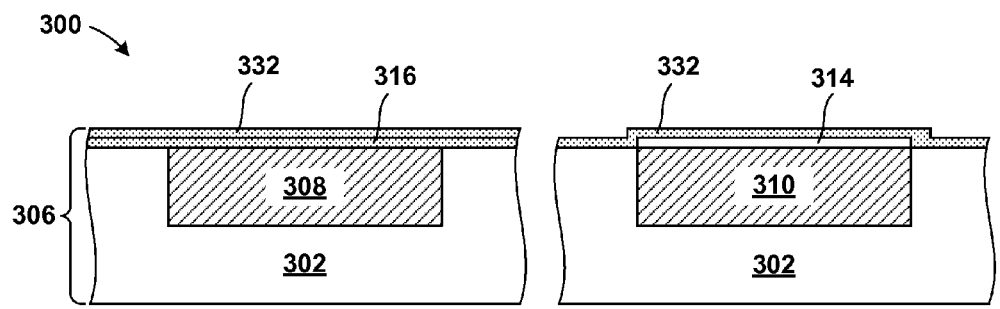

Referring now to FIG. 3D, the mask 312 may be removed. When the soft mask is used, it can be removed, for example, by ashing, after deposition of the conductive cap 314. When the hardmask mask is used, it can be removed, for example, by selective etching, after deposition of the conductive cap 314. A second $M_x$ cap dielectric 332 may be deposited over the structure 300. Like the first $M_x$ cap dielectric 316, the second $M_x$ cap dielectric 332 may additionally electrically insulate the $M_x$ level 306 from additional interconnect levels (not shown) that may be subsequently formed above the $M_x$ level 306. The second $M_x$ cap dielectric 332 may be deposited using typical deposition techniques, for example, chemical vapor deposition. The second $M_x$ cap dielectric 332 may include, for example, $Si_3N_4$, SiC, SiCN, SiCH, or other known capping materials. The second $M_x$ cap dielectric 332 may have a thickness ranging from about 10 nm to about 15 nm and ranges there between, although a thickness less than 10 nm and greater than 15 nm may be acceptable. The second $M_x$ cap dielectric 332 may be deposited on top of the first $M_x$ cap dielectric 316 above the first $M_x$ metal 308 and on top of the conductive cap 314 above the second $M_x$ metal 310, as shown in FIG. 3D.

With continued reference to FIG. 3D, the first $M_x$ cap dielectric 316 and the second $M_x$ cap dielectric 332 located above the first $M_x$ metal 308 may have a total thickness ranging from about 20 nm to about 30 nm and ranges there between. The conductive cap 314 and the second $M_x$ cap dielectric 332 located above the second $M_x$ metal 310 may have a combined thickness ranging from about 20 nm to about 30 nm. The process described above, in which two cap dielectrics may be deposited above the first $M_x$ metal 308, and the conductive cap 314 and a single cap dielectric may be deposited above the second $M_x$ metal 310 may be advantageous because the resulting height above the first $M_x$ metal 308 and the second $M_x$ metal 310 may be substantially equal. In comparison, with reference to FIG. 2C, in which the resulting height of the second $M_x$ cap dielectric 216 above the first $M_x$ metal 208 may not be substantially equal to the resulting height of the conductive cap 214 plus the $M_x$ cap dielectric 216 above the second $M_x$ metal 210.

Figure 3E:
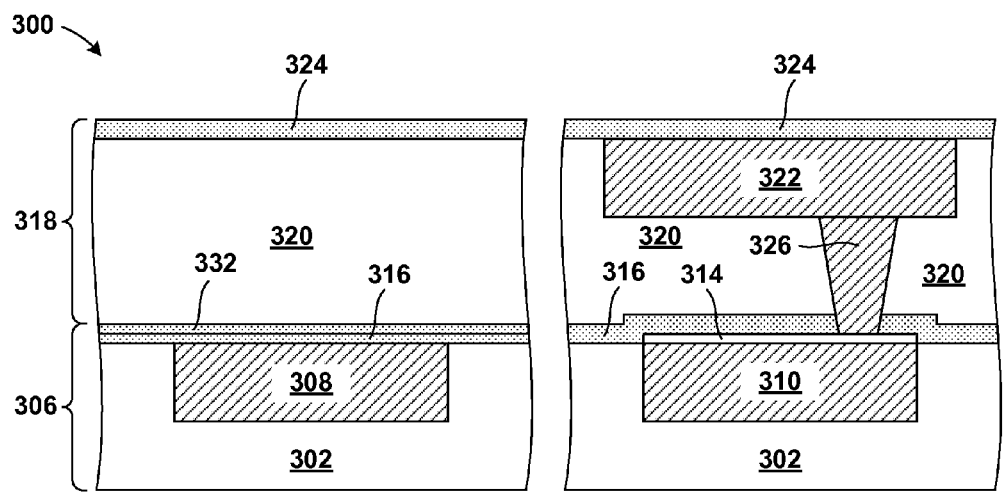

Referring now to FIG. 3E, an $M_{x+1}$ level 318 located above the $M_x$ level 306 is shown. The $M_{x+1}$ level 318 may include an $M_{x+1}$ dielectric 320 and an $M_{x+1}$ metal 322. Like the $M_x$ dielectric 302, the $M_{x+1}$ dielectric 320 may be, for example, $SiO_2$, $Si_3N_4$, SiCOH, SiLK, JSR, or porous dielectrics. It should be noted that while only two interconnect levels are shown, the structure 300 may have multiple interconnect levels above the $M_{x+1}$ level 318 and below the $M_x$ level 306. An $M_{x+1}$ cap dielectric 324 may be deposited over the structure 300 and above the $M_{x+1}$ level 318. The $M_{x+1}$ cap dielectric 324 may electrically insulate the $M_{x+1}$ level 318 from additional interconnect levels (not shown) that may be subsequently formed above the $M_{x+1}$ level 318. Like the first $M_x$ cap dielectric 316 and the second $M_x$ cap dielectric 332, the $M_{x+1}$ cap dielectric 324 may be deposited using typical deposition techniques, for example, chemical vapor deposition. The $M_{x+1}$ cap dielectric 324 may include, for example, $Si_3N_4$, SiC, SiCN, SiCH, or other known capping materials. The $M_{x+1}$ cap dielectric 324 may have a thickness ranging from about 20 nm to about 30 nm and ranges there between, although a thickness less than 20 nm and greater than 30 nm may be acceptable.

The $M_{x+1}$ metal 322 and a via 326 may be formed in the $M_{x+1}$ dielectric 320 in accordance with typical techniques. The $M_{x+1}$ metal 322 may consist of a typical line or wire found in a typical semiconductor circuit and may consist of a line or wire which will form the base structure for the vertical e-fuse. The via 326 may typically be formed concurrent with the formation of the $M_{x+1}$ metal 322. The $M_{x+1}$ metal 322 and the via 326 may be fabricated using, for example, a typical double damascene technique in which the conductive interconnect material may be deposited in a via and a trench formed in the $M_{x+1}$ dielectric layer 320. In one embodiment, the $M_{x+1}$ metal 322 and the via 326 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique.

Vias, generally, may be used to form electrical connections between the metallization of two interconnect levels. The via 326 may provide an electrical connection between the second $M_x$ metal 310 and the $M_{x+1}$ metal 322. The via 326 may have an aspect ratio of about 4:1 or more, and a diameter or width ranging from about 10 nm to about 50 nm and ranges there between, although a via diameter less than 20 nm and greater than 50 nm may be acceptable.

With continued reference to FIG. 3E, the final vertical e-fuse structure is shown. The left side of FIG. 3E represents a non-fuse structure, while the right side of FIG. 3E represents the vertical e-fuse structure. The second $M_x$ metal 310, the $M_{x+1}$ metal 322, and the via 326 together form the final vertical e-fuse structure. It should be noted that neither the first $M_x$ metal 308 nor the $M_{x+1}$ metal 322 have a conductive cap. Assuming current flows from the second $M_x$ metal 310 to the $M_{x+1}$ metal 322, the addition of the conductive cap 314, on top of the second $M_x$ metal 310, improves EM resistance of the vertical e-fuse between the second $M_x$ metal 310 and the via 326, while simultaneously decreasing EM resistance of the vertical e-fuse between the via 326 and the $M_{x+1}$ metal 322. Increased EM resistance of the vertical e-fuse between the second $M_x$ metal 310 and the via 326 may help prevent the migration of the conductive interconnect material from the second $M_x$ metal 310 to the via 326. This in turn may prevent the formation of voids 120 (shown in FIG. 1) from forming in the second $M_x$ metal 310 and causing the undesirable open circuit in the second $M_x$ metal 310.

Figure 3F:
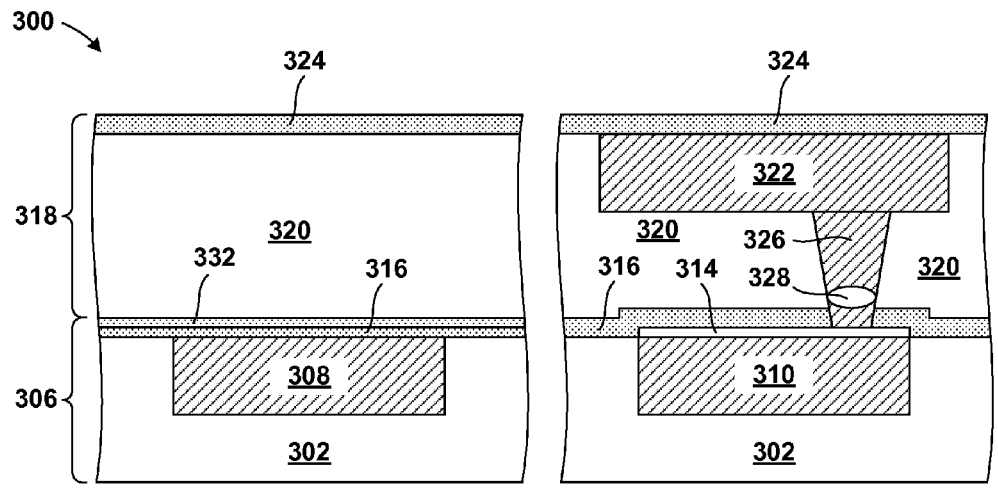
FIG. 3F depicts the final vertical e-fuse structure after programming according to an exemplary embodiment.

Now referring to FIG. 3F, the final vertical e-fuse structure is shown after programming. Decreased EM resistance of the vertical e-fuse between the via 326 and the $M_{x+1}$ metal 322 may result in the migration of the conductive interconnect material from the via 326 to the $M_{x+1}$ metal 322 and encourage the formation of a void 328 in the via 326. This configuration may provide more consistency and reliability during programming of the vertical e-fuse because the void 328, or open circuit, may be more likely located in the via 326 as opposed to the second $M_x$ metal 310. Therefore, programming may not affect any other circuit other than the targeted e-fuse because the void 328, or open circuit, may be consistently located only in the via 326.

Another method by which to ensure that only the vertical e-fuse is affected by programming is described in detail below by referring to the accompanying drawings FIGS. 4A-4E. It should be noted that while only two $M_x$ metals are depicted in the following set of drawings a single chip may include more than two $M_x$ metals.

Figure 4A:
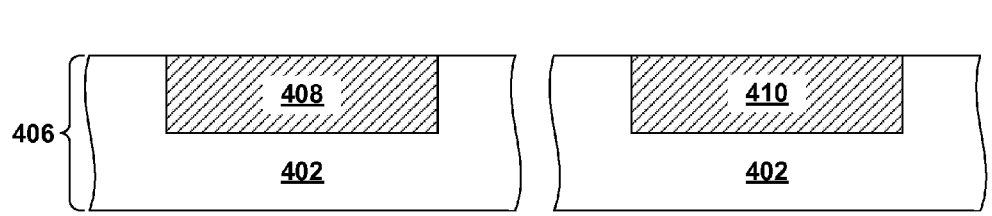
FIGS. 4A-4E illustrate the steps of a method of forming a vertical e-fuse according to an exemplary embodiment.

Referring now to FIG. 4A, a structure 400 is shown. The structure 400 may include an $M_x$ level 406. The $M_x$ level 406 may include an $M_x$ dielectric 402, a first $M_x$ metal 408, a second $M_x$ metal 410, and an $M_x$ cap dielectric 416 (not shown, see FIG. 4D). The $M_x$ dielectric 402 may be, for example, $SiO_2$, $Si_3N_4$, SiCOH, SiLK, JSR, or porous dielectrics. The $M_x$ level 406 may be any interconnect level in the structure 400. It should be noted that while only a single interconnect level is shown, the structure 400 may have multiple interconnect levels above and below the $M_x$ level 406. The $M_x$ cap dielectric 416 may be subsequently deposited during a later step (see FIG. 4D).

The first $M_x$ metal 408 and the second $M_x$ metal 410 may be formed in the $M_x$ dielectric 402 in accordance with typical techniques. The first $M_x$ metal 408 may consist of a typical line or wire found in a typical semiconductor circuit and the second $M_x$ metal 410 may consist of a line or wire which will form the base structure for a vertical e-fuse. The first $M_x$ metal 408 and the second $M_x$ metal 410 may be fabricated using, for example, a typical single damascene technique in which a conductive interconnect material may be deposited in a trench formed in the $M_x$ dielectric 402. In one embodiment, the first $M_x$ metal 408 and the second $M_x$ metal 410 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited using an electroplating technique prior to filling the trench.

Figure 4B:
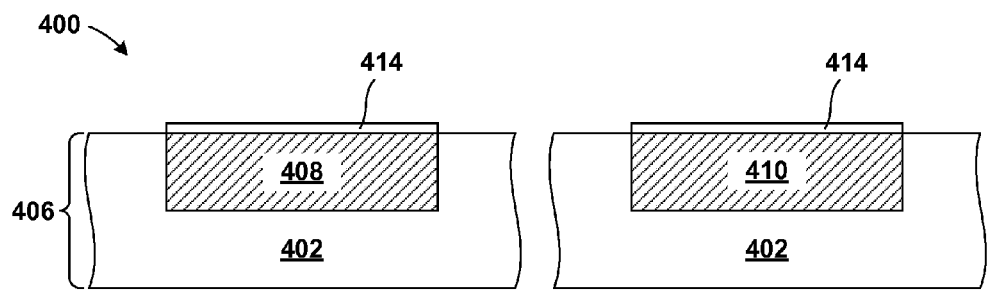

Referring now to FIG. 4B, a conductive cap 414 may then be selectively deposited on top of the first $M_x$ metal 408 and the second $M_x$ metal 410. The conductive cap 414 may include, for example, Co (W,P,B), Ru, Ir, Rh, Pt, Mn, or an alloy thereof. The conductive cap 414 may have a thickness ranging from about 5 nm to about 10 nm and ranges there between, although a thickness less than 5 nm and greater than 10 nm may be acceptable. The conductive cap 414 may be deposited by chemical vapor deposition, atomic layer deposition, electroplating, and electroless plating techniques. In one embodiment, the conductive cap 414 may include, for example, CoWP deposited using a plating technique where the interconnect material of the first $M_x$ metal 408 and the second $M_x$ metal 410 serve as a seed. Persons having ordinary skill in the art will understand that the conductive cap 414 may include other materials, depending on the desired programming efficiencies of the e-fuse.

Figure 4C:
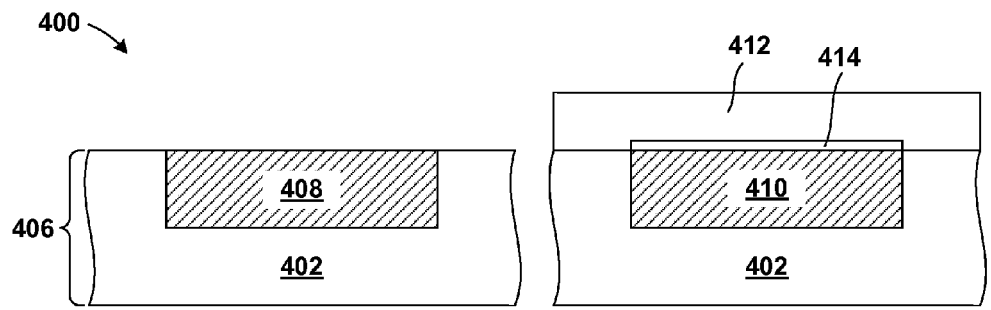

Referring now to FIG. 4C, a mask 412 may be applied on top of the conductive cap 414 above the second $M_x$ metal 410. The mask 412 may be applied above all areas of the structure 400 related to the formation of a vertical e-fuse. The mask 412 can be a soft mask such as photoresist or a hardmask layer such as TEOS (silicon nitride). Both the soft mask and the hard mask may be suitable for protecting against a subsequent etching technique. A portion (shown in FIG. 4B) of the conductive cap 414 positioned above the first $M_x$ metal 408 may be removed. The portion of the conductive cap 414 may be removed using any suitable etching technique such as dry etch, wet etch, or combination of both. In one embodiment, the portion of the conductive cap 414 may be removed using dry etch such as plasma etch. Removal of the conductive cap 414 may expose the interconnect material of the first $M_x$ metal 408.

Figure 4D:
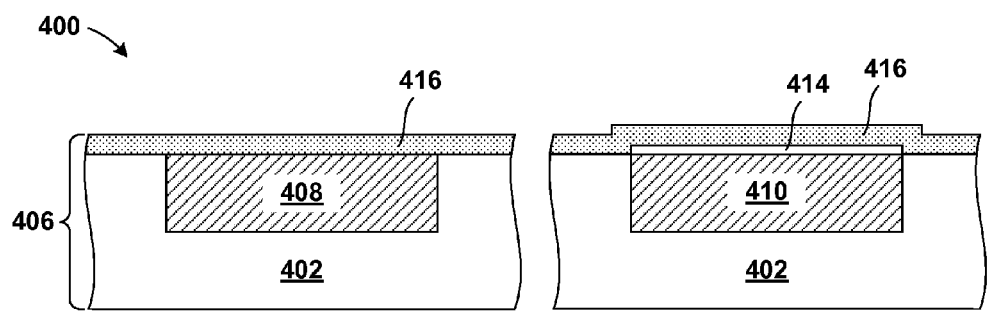

Referring now to FIG. 4D, the mask 412 (shown in FIG. 4C) may be removed. When the soft mask is used, it can be removed, for example, by ashing, after removal of the conductive cap 414. When the hardmask mask is used, it can be removed, for example, by selective etching, after removal of the conductive cap 414. The $M_x$ cap dielectric 416 may be deposited over the structure 400. The $M_x$ cap dielectric 416 may additionally electrically insulate the $M_x$ level 406 from additional interconnect levels (not shown) that may be subsequently formed above the $M_x$ level 406. The $M_x$ cap dielectric 416 may be deposited using typical deposition techniques, for example, chemical vapor deposition. The $M_x$ cap dielectric 416 may include, for example, $Si_3N_4$, SiC, SiCN, SiCH, or other known capping materials. The $M_x$ cap dielectric 416 may have a thickness ranging from about 20 nm to about 30 nm and ranges there between, although a thickness less than 20 nm and greater than 30 nm may be acceptable. The $M_x$ cap dielectric 416 may be deposited on top of the first $M_x$ metal 408 and on top of the conductive cap 414 above the second $M_x$ metal 410, as shown in FIG. 4D.

Figure 4E:
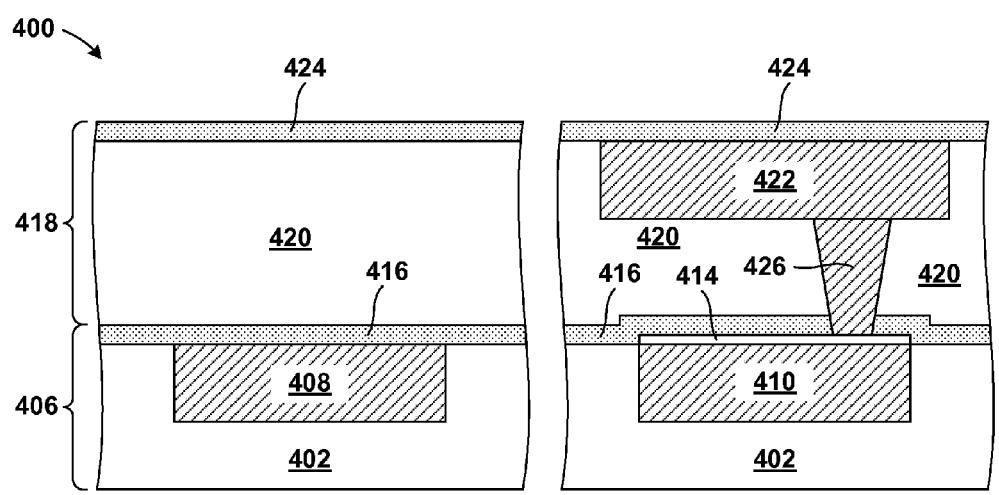

Referring now to FIG. 4E, an $M_{x+1}$ level 418 located above the $M_x$ level 406 is shown. The $M_{x+1}$ level 418 may include an $M_{x+1}$ dielectric 420 and an $M_{x+1}$ metal 422. Like the $M_x$ dielectric 402, the $M_{x+1}$ dielectric 420 may be, for example, $SiO_2$, $Si_3N_4$, SiCOH, SiLK, JSR, or porous dielectrics. It should be noted that while only two interconnect levels are shown, the structure 400 may have multiple interconnect levels above the $M_{x+1}$ level 418 and below the $M_x$ level 406. An $M_{x+1}$ cap dielectric 424 may be deposited over the structure 400 and above the $M_{x+1}$ level 418. The $M_{x+1}$ cap dielectric 424 may electrically insulate the $M_{x+1}$ level 418 from additional interconnect levels (not shown) that may be subsequently formed above the $M_{x+1}$ level 418. Like the $M_x$ cap dielectric 416, the $M_{x+1}$ cap dielectric 424 may be deposited using typical deposition techniques, for example, chemical vapor deposition. The $M_{x+1}$ cap dielectric 424 may include, for example, $Si_3N_4$, SiC, SiCN, SiCH, or other known capping materials. The $M_{x+1}$ cap dielectric 424 may have a thickness ranging from about 20 nm to about 30 nm and ranges there between, although a thickness less than 20 nm and greater than 30 nm may be acceptable.

The $M_{x+1}$ metal 422 and a via 426 may be formed in the $M_{x+1}$ dielectric 420 in accordance with typical techniques. The $M_{x+1}$ metal 422 may consist of a typical line or wire found in a typical semiconductor circuit and may consist of a line or wire which will form the base structure for the vertical e-fuse. The via 426 may typically be formed concurrent with the formation of the $M_{x+1}$ metal 422. The $M_{x+1}$ metal 422 and the via 426 may be fabricated using, for example, a typical double damascene technique in which the conductive interconnect material may be deposited in a via and a trench formed in the $M_{x+1}$ dielectric 420. In one embodiment, the $M_{x+1}$ metal 422 and the via 426 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique.

Vias, generally, may be used to form electrical connections between the metallization of two interconnect levels. The via 426 may provide an electrical connection between the second $M_x$ metal 410 and the $M_{x+1}$ metal 422. The via 426 may have an aspect ratio of about 4:1 or more and a diameter or width ranging from about 10 nm to about 50 nm and ranges there between, although a via diameter less than 10 nm and greater than 50 nm may be acceptable.

With continued reference to FIG. 4E, the final vertical e-fuse structure is shown. The left side of FIG. 4E represents a non-fuse structure, while the right side of FIG. 4E represents the vertical e-fuse structure. The second $M_x$ metal 410, the $M_{x+1}$ metal 422, and the via 426 together form the final vertical e-fuse structure. It should be noted that neither the first $M_x$ metal 408 nor the $M_{x+1}$ metal 422 have a conductive cap. Assuming current flows from the second $M_x$ metal 410 to the $M_{x+1}$ metal 422, the addition of the conductive cap 414, on top of the second $M_x$ metal 410, improves EM resistance of the vertical e-fuse between the second $M_x$ metal 410 and the via 426, while simultaneously decreasing EM resistance of the vertical e-fuse between the via 426 and the $M_{x+1}$ metal 422. Increased EM resistance of the vertical e-fuse between the second $M_x$ metal 410 and the via 426 may help prevent the migration of the conductive interconnect material from the second $M_x$ metal 410 to the via 426. This in turn may prevent the formation of voids 120 (shown in FIG. 1) from forming in the second $M_x$ metal 410 and causing the undesirable open circuit in the second $M_x$ metal 410.

Figure 4F:
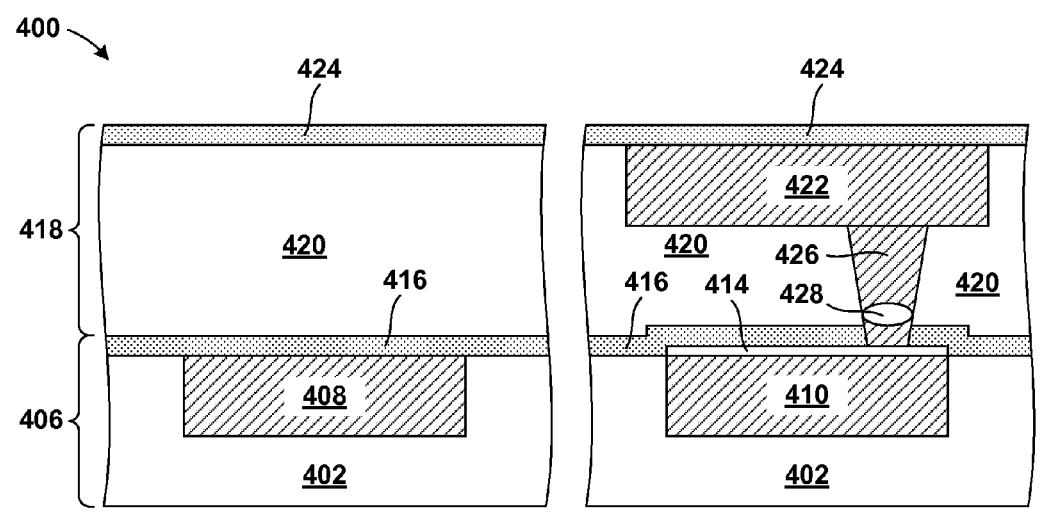
FIG. 4F depicts the final vertical e-fuse structure after programming according to an exemplary embodiment.

Now referring to FIG. 4F, the final vertical e-fuse structure is shown after programming. Decreased EM resistance of the vertical e-fuse between the via 426 and the $M_{x+1}$ metal 422 may result in the migration of the conductive interconnect material from the via 426 to the $M_{x+1}$ metal 422 and encourage the formation of a void 428 in the via 426. This configuration may provide more consistency and reliability during programming of the vertical e-fuse because the void 428, or open circuit, may be more likely located in the via 426 as opposed to the second $M_x$ metal 410. Therefore, programming may not affect any other circuit other than the targeted e-fuse because the void 428, or open circuit, may be consistently located only in the via 426.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An electronic fuse structure comprising:
an $M_x$ level comprising a first $M_x$ metal and a second $M_x$ metal embedded in an $M_x$ dielectric, a top surface of the first $M_x$ metal and a top surface of the second $M_x$ metal are coplanar;
an $M_{x+1}$ level immediately above the $M_x$ level, the $M_{x+1}$ level comprising an $M_{x+1}$ metal embedded in an $M_{x+1}$ dielectric;
a conductive cap covering an entire top surface of the first $M_x$ metal and separating the top surface of the first $M_x$ metal from a cap dielectric;
the cap dielectric positioned between the $M_x$ level and the $M_{x+1}$ level in direct contact with the entire top surface of the second $M_x$ metal and covering a portion of a top surface and entire sidewalls of the conductive cap, and the cap dielectric having a substantially uniform thickness on the top surfaces of the first $M_x$ metal and the second $M_x$ metal; and
a via electrically connecting the first $M_x$ metal to the $M_{x+1}$ metal in a vertical orientation, the conductive cap separates the first $M_x$ metal from the via.

2. The structure of claim 1, wherein the conductive cap comprises a material selected from the group consisting Co(W,P,B), Ru, Ir, Rh, Pt, Mn, and an alloy thereof.

3. The structure of claim 1, wherein the conductive cap comprises CoWP.

4. The structure of claim 1, wherein the first $M_x$ metal, the $M_{x+1}$ metal, and the via are made from a conductive material selected from the group consisting of Cu, Al, and W.

5. The structure of claim 1, further comprising:
a void located within the via causing the resistance of the electronic fuse structure to be greater than or equal to about 10K ohms.

6. An electronic fuse structure comprising:
an $M_x$ level and an $M_{x+1}$ level separated by a cap dielectric which covers a portion of a top surface and entire sidewalls of a conductive cap above a first $M_x$ metal and in direct contact with an entire top surface of a second $M_x$ metal,
the cap dielectric has a substantially uniform thickness on a top surface of the first $M_x$ metal and the top surface of the second $M_x$ metal, the top surface of the first $M_x$ metal and the top surface of the second $M_x$ metal are coplanar, the conductive cap covers the entire top surface and separates the top surface of the first $M_x$ metal from the cap dielectric; and
a via electrically connecting the first $M_x$ metal to an $M_{x+1}$ metal in a vertical orientation, the conductive cap separates the first $M_x$ metal from the via.

7. The structure of claim 6, wherein the conductive cap comprises a material selected from the group consisting Co(W,P,B), Ru, Ir, Rh, Pt, Mn, and an alloy thereof.

8. The structure of claim 6, wherein the conductive cap comprises CoWP.

9. The structure of claim 6, wherein the $M_x$ metal, the $M_{x+1}$ metal, and the via are made from a conductive material selected from the group consisting of Cu, Al, and W.

10. The structure of claim 6, further comprising:
a void located within the via causing the resistance of the electronic fuse structure to be greater than or equal to about 10K ohms.

11. An electronic fuse structure comprising:
an $M_x$ level comprising a first Mx metal and a second $M_x$ metal embedded in an $M_x$ dielectric, a top surface of the first $M_x$ metal and a top surface of the second $M_x$ metal are coplanar;
an $M_{x+1}$ level immediately above the $M_x$ level, the $M_{x+1}$ level comprising an $M_{x+1}$ metal embedded in an $M_{x+1}$ dielectric;
a cap dielectric positioned between the $M_x$ level and the $M_{x+1}$ level, the cap dielectric is in direct contact with the entire top surface of the second $M_x$ metal and in direct contact with a top surface of a conductive cap above the first $M_x$ metal, the conductive cap covers the entire top surface of the first $M_x$ metal and separates the top surface of the first $M_x$ metal from the cap dielectric, the cap dielectric having a substantially uniform thickness on the top surfaces of the first $M_x$ metal and the second $M_x$ metal, and the cap dielectric covers a portion of a top surface and entire sidewalls of the conductive cap; and
a via electrically connecting the first $M_x$ metal to the $M_{x+1}$ metal in a vertical orientation, the conductive cap separates the first $M_x$ metal from the via.

12. The structure of claim 11, wherein the conductive cap comprises a material selected from the group consisting Co(W,P,B), Ru, Ir, Rh, Pt, Mn, and an alloy thereof.

13. The structure of claim 11, wherein the conductive cap comprises CoWP.

14. The structure of claim 11, further comprising:
a void located within the via causing the resistance of the electronic fuse structure to be greater than or equal to about 10K ohms.

15. The structure of claim 11, wherein the $M_x$ metal, the $M_{x+1}$ metal, and the via are made from a conductive material selected from the group consisting of Cu, Al, and W.

* * * * *